(12) United States Patent
Leconte et al.

(10) Patent No.: US 11,293,100 B2
(45) Date of Patent: Apr. 5, 2022

(54) DEVICE FOR SYNTHESISING CORE-SHELL NANOPARTICLES BY LASER PYROLYSIS AND ASSOCIATED METHOD

(71) Applicant: COMMISSARIAT A L'ENERGIE ATOMIQUE ET AUX ENERGIES ALTERNATIVES, Paris (FR)

(72) Inventors: Yann Leconte, Saint-Remy les Chevreuse (FR); Olivier Sublemontier, Fontenay Aux Roses (FR); Nathalie Herlin-Boime, Orsay (FR); Cécile Reynaud, Cachan (FR); Dominique Porterat, Orsay (FR); Axelle Quinsac, Montigny-le-Bretonneux (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 531 days.

(21) Appl. No.: 14/646,781

(22) PCT Filed: Nov. 25, 2013

(86) PCT No.: PCT/EP2013/074537
§ 371 (c)(1),
(2) Date: May 22, 2015

(87) PCT Pub. No.: WO2014/079997
PCT Pub. Date: May 30, 2014

(65) Prior Publication Data
US 2015/0299861 A1    Oct. 22, 2015

(30) Foreign Application Priority Data
Nov. 26, 2012 (FR) .................................... 12 61243

(51) Int. Cl.
*C23C 16/48* (2006.01)
*B22F 1/00* (2022.01)
(Continued)

(52) U.S. Cl.
CPC .............. *C23C 16/483* (2013.01); *B01J 13/02* (2013.01); *B01J 19/121* (2013.01);
(Continued)

(58) Field of Classification Search
None
See application file for complete search history.

(56) References Cited

U.S. PATENT DOCUMENTS 4,642,227 A * 2/1987 Flagan ..................... B01J 6/008
                                                              118/716
4,726,320 A * 2/1988 Ichikawa ............... C23C 16/483
                                                              118/715
(Continued)

FOREIGN PATENT DOCUMENTS

WO    WO 2006/051233 A1    5/2006

OTHER PUBLICATIONS

International Search Report and Written Opinion for Application No. PCT/EP2013/074537 dated Feb. 13, 2014.
(Continued)

Primary Examiner — Joel G Horning
(74) Attorney, Agent, or Firm — Alston & Bird LLP

(57) ABSTRACT

A device for synthesising core-shell nanoparticles by laser pyrolysis is provided. The device includes a reactor having a first chamber for synthesising the core, which is provided with an inlet for a core precursor; a second chamber for synthesising the shell, which is provided with an inlet for a shell precursor; and at least one communication channel between the two chambers for transmitting the core of the nanoparticles to be formed in the first chamber towards the (Continued)

second chamber. The device also includes an optical device for illuminating each of the two chambers, and at least one laser capable of emitting a laser beam intended to interact with the precursors in order to form the core and the shell.

23 Claims, 3 Drawing Sheets

(51) Int. Cl.

| | |
|---|---|
| B01J 13/02 | (2006.01) |
| B01J 19/12 | (2006.01) |
| C01B 33/027 | (2006.01) |
| C23C 16/44 | (2006.01) |
| C01B 32/05 | (2017.01) |
| B22F 9/30 | (2006.01) |
| B22F 1/02 | (2006.01) |
| C23C 16/02 | (2006.01) |
| C23C 16/26 | (2006.01) |
| C23C 16/52 | (2006.01) |
| H01M 4/62 | (2006.01) |
| H01M 4/36 | (2006.01) |
| H01M 4/38 | (2006.01) |
| H01M 4/134 | (2010.01) |

(52) U.S. Cl.
CPC ............ *B22F 1/0018* (2013.01); *B22F 1/02* (2013.01); *B22F 9/30* (2013.01); *C01B 32/05* (2017.08); *C01B 33/027* (2013.01); *C23C 16/0263* (2013.01); *C23C 16/26* (2013.01); *C23C 16/4417* (2013.01); *C23C 16/52* (2013.01); *B01J 2219/00033* (2013.01); *B22F 2999/00* (2013.01); *H01M 4/134* (2013.01); *H01M 4/366* (2013.01); *H01M 4/386* (2013.01); *H01M 4/625* (2013.01)

(56) References Cited

U.S. PATENT DOCUMENTS

| | | | |
|---|---|---|---|
| 5,958,348 A * | 9/1999 | Bi | ............ B01J 12/005 266/168 |
| 6,803,073 B2 | 10/2004 | Doan | |
| 2003/0157867 A1 | 8/2003 | Doan | |
| 2007/0295702 A1 | 12/2007 | Tenegal et al. | |
| 2008/0175988 A1* | 7/2008 | Chiu | ............ C03C 17/22 427/163.2 |
| 2009/0014921 A1 | 1/2009 | Tenegal et al. | |
| 2009/0258244 A1* | 10/2009 | Becker | ............ B82Y 30/00 428/570 |
| 2009/0309014 A1* | 12/2009 | Vidal-de-Miguel | ............ G01N 1/2208 250/281 |

OTHER PUBLICATIONS

Leconte, Y., et al., *Application of the Laser Pyrolysis to the Synthesis of SiC, TiC and ZrC Pre-ceramics Nanopowders*, J. Anal. Appl. Pyrolysis, vol. 79, No. 1-2 (Apr. 2007) 465-470.

* cited by examiner

DEVICE FOR SYNTHESISING CORE-SHELL NANOPARTICLES BY LASER PYROLYSIS AND ASSOCIATED METHOD

FIELD

The present invention relates to a device and a process for synthesizing core-shell nanoparticles by laser pyrolysis.

BACKGROUND

The term "nanoparticles" is understood to mean particles the dimensions of which are each smaller than one micron.

Core-shell nanoparticles consist of a core encapsulated in a shell. This encapsulation may be complete or partial, as the various schematic drawings a, b, c and d of FIG. 1 show. In these drawings, the core is referenced 150 and the shell 160.

Laser pyrolysis is widely employed to synthesize core-shell nanoparticles.

An example of a device employed for this purpose is described in the article by Veintemillas-Verdaguer et al., "*Continuous production of inorganic magnetic nanocomposites for biomedical applications by laser pyrolysis*", Journal of Magnetism and Magnetic Materials, 311 (2007), pp. 120-124 (D1).

In the article D1, the device for synthesizing core-shell nanoparticles by laser pyrolysis comprises a chamber, an inlet into the chamber for the core and shell precursors, and a laser arranged to illuminate these precursors in the chamber in order to form the nanoparticles. Thus, the core and shell precursors are injected together into the chamber.

This device is advantageous because it allows core-shell nanoparticles to be formed continuously.

The authors provide examples of nanoparticles capable of being synthesized with this device. These are nanoparticles the core of which is made of iron (Fe) and the shell of carbon (C) or, depending on the precursors used, nanoparticles the core of which is made of iron (Fe) and the shell of silicon dioxide ($SiO_2$).

However, a major drawback of this device is that it does not allow any type of core-shell nanoparticle to be formed.

Specifically, to form these nanoparticles, the core must be formed first then the shell must be formed and deposited around the core formed beforehand.

With this device, thermodynamics therefore prevent certain core-shell nanoparticles from being formed. For example, although this device allows nanoparticles the core of which is made of iron (Fe) and the shell of which is made of carbon (C) to be formed, it does not allow nanoparticles having the inverse structure to be formed, i.e. nanoparticles the core of which is made of carbon (C) and the shell of iron (Fe).

In addition, depending on the nature of the precursors present, certain mixtures of precursors will lead not to the formation of core-shell nanoparticles, but instead to the formation of nanoparticles consisting of an alloy or of complex phases of the materials present.

It should moreover be noted that there are devices for synthesizing core-shell nanoparticles that, in contrast to the device proposed in the article D1, may synthesize nanoparticles independently of the chemical nature of the core and shell.

To do this, the synthesis of the nanoparticles is carried out in successive steps of synthesis of the core then synthesis of the shell that use different techniques.

For example, Yoon Hwa et al., "*High capacity and rate capability of core-shell structured nano-Si/C anode for Li-ion batteries*", Electrochemica Acta 71 (2012), pp. 201-205 (D2) propose a process for synthesizing nanoparticles the cores of which are made of silicon (Si) and the shells of carbon (C).

The silicon cores are produced by chemical processing. In this particular case, the silicon, in the form of a nanopowder, is dipped into a specific solution that has been prepared beforehand. Next, the solution is stirred for 5 mn. The solution is then centrifuged a number of times, each centrifuging operation lasting 10 mn. Drying is then carried out at 60° C. for 24 h in order to obtain the nanoparticles intended to form the core of the core-shell nanoparticles.

Next, the carbon shell is produced by physical processing. In this particular case, it is a question of a calcination operation carried out at 750° C. for 3 h under an inert atmosphere.

The nanoparticles are therefore synthesized in two clearly separate steps that moreover employ different techniques.

Although the approach proposed in the article D2 allows core-shell nanoparticles to be formed with a greater variety of constituents than the laser pyrolysis process proposed in the article D1, this approach is however more time-consuming to implement.

In addition, it cannot be carried out continuously in one and the same device because it requires the implementation of different techniques (chemical processing for the core and physical processing for the shell).

SUMMARY

One objective of the invention is to provide a solution that overcomes the aforementioned drawbacks.

Thus, one objective of the invention is to provide a solution allowing, for a wide range of core and shell materials, core-shell nanoparticles to be synthesized continuously.

Advantageously, one objective of the invention is to provide a solution allowing core-shell nanoparticles to be synthesized continuously no matter what the chemical nature of the materials forming the core and shell.

To achieve at least one of these objectives, the invention provides a device for synthesizing core-shell nanoparticles by laser pyrolysis, characterized in that it comprises:
  a reactor comprising:
    a first chamber for the synthesis of the core, which chamber is equipped with an inlet for a core precursor;
    a second chamber for the synthesis of the shell, which chamber is equipped with an inlet for a shell precursor; and
    at least one communication channel between the two chambers for transmitting the nanoparticle cores intended to be formed in the first chamber in the direction of the second chamber; and
  an optical device for illuminating each of the two chambers, this device comprising at least one laser able to emit a laser beam intended to interact with said precursors in order to form the core and the shell.

The device according to the invention will possibly also comprise one or more of the following features:
  the optical device comprises a plurality of mirrors arranged so that the laser beam emitted by the laser is able to illuminate the two chambers in succession;
  the optical device comprises at least one beam splitter for adjusting the power of the laser beam in each of the two chambers, this beam splitter for example being located between two mirrors;

the optical device comprises a beam splitter and at least one mirror arranged so that the laser beam emitted by the laser is divided into two beams each able to illuminate one of the two chambers;

the optical device comprises a first laser for illuminating the first chamber and a second laser for illuminating the second chamber;

the optical device comprises at least one focusing means placed between the or each laser and at least one of the two chambers;

the distance between said at least one focusing means and the neighboring chamber is adjustable;

the focusing means comprising two cylindrical lenses, the distance between the two cylindrical lenses is adjustable;

the inlet of the shell precursor into the second chamber is one end of a supply channel for supplying this precursor, one portion of which is housed inside the communication channel between the two chambers;

the inlet of the shell precursor into the second chamber is one end of a supply channel for supplying this precursor, one portion of which encircles the communication channel between the two chambers;

the portion of the supply channel for supplying the shell precursor, which, depending on the case, is housed inside the communication channel or which encircles this communication channel, extends colinearly with the communication channel;

the reactor comprises a supply channel for supplying the shell precursor and opening into the communication channel between the two chambers, the inlet of the shell precursor then being that end of the communication channel between the two chambers which opens into the second chamber;

the reactor comprises an additional communication channel between the two chambers, said channel encircling the communication channel between these two chambers;

the inlet of the core precursor into the first chamber is one end of a supply channel for supplying this precursor, one portion of which is encircled by a portion of a channel connected to a source of inert gas; and that portion of the supply channel for supplying the core precursor which is encircled by a portion of the channel connected to the source of inert gas extends colinearly with this portion of said channel.

To achieve at least one of these objectives, the invention also provides a process for synthesizing core-shell nanoparticles by laser pyrolysis, characterized in that it comprises the following steps:

(a) injecting a core precursor into a first chamber of a reactor;
(b) illuminating the core precursor with a laser beam in order to form, by pyrolysis, nanoparticle cores;
(c) transporting the nanoparticle cores thus formed in step (b) into a second chamber of the reactor communicating with the first chamber;
(d) injecting a shell precursor into the second chamber of the reactor; and
(e) illuminating the shell precursor with a laser beam in order to form, by pyrolysis, the shell of the nanoparticles and ensure this shell is deposited around the cores.

The process according to the invention will possibly also comprise one or more of the following features:

step (a) and/or step (d) are/is carried out using an inert gas such as argon;

the process comprises a step consisting in modifying the distance between a means for focusing the laser beam and the neighboring chamber of the reactor; and the pressure in the first chamber is higher than the pressure in the second chamber.

Other features, aims and advantages of the invention are set forth in the following detailed description, which is given with reference to the following figures:

DETAILED DESCRIPTION

Figure 2:
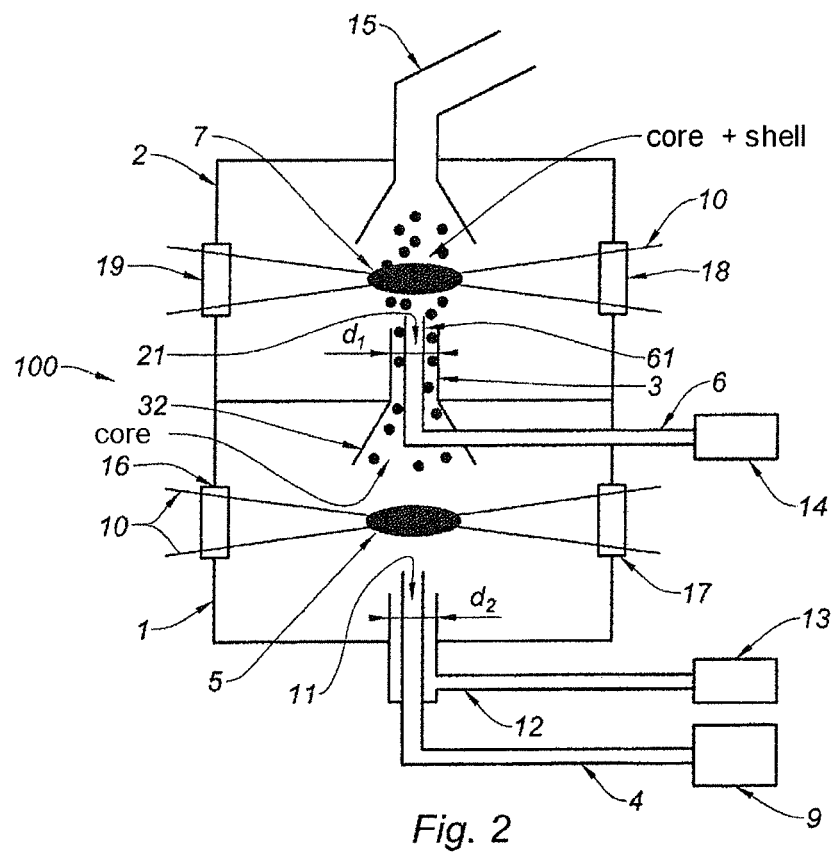
FIG. 2 is a schematic showing a reactor of the device according to the invention.

In FIG. 2, the reactor 100 comprises a first chamber 1, a second chamber 2 and a communication channel 3 between the two chambers 1, 2. In this particular case, the reactor 100 is arranged vertically, so that the second chamber 2 is located above the first chamber 1.

The first chamber 1 is equipped with an inlet 11 for a core precursor. The second chamber 2 is also equipped with an inlet 21, in the present case for a shell precursor. Thus, the first chamber 1 is dedicated to the synthesis of the core, and the second chamber 2 to the synthesis of the shell and to the definitive formation of the core-shell nanoparticles.

The inlets 11, 21 will generally take the form of injection nozzles.

The core and shell will therefore be synthesized successively in time and space. Nonetheless, the nanoparticles may indeed be produced continuously provided that each inlet 11, 21 is supplied with a continuous flow of a precursor dedicated, depending on the case, to the synthesis of the core or to the synthesis of the shell.

This reactor limits the formation of oxides or chemical compounds other than core-shell nanoparticles as the exposure time of the silicon core to ambient air in the first chamber 1 is decreased, especially because of the continuous production mode. In addition, this reactor limits the possible formation, in the second chamber 2, of alloys of the materials forming the core and shell, especially because the core, then the shell, are formed in succession.

In addition, the fact that there are two clearly separate chambers 1, 2, connected via a communication channel 3, makes it possible to better control the movement of the (silicon) core particles, making it possible to limit, as they are conveyed to the zone of interest in the second chamber 2, the risk that these core particles will, for example, make contact with the walls of the second chamber 2 and therefore become chemically polluted.

The pressure in the two chambers may be the same. However, employing two separate chambers 1, 2 connected via a communication channel 3 allows a pressure differential to be established between the two chambers 1, 2. In such a case, the first chamber 1, at higher pressure, promotes uniform nucleation of the (silicon, for example) core, and the second chamber 2, at a lower pressure, promotes non-uniform nucleation, namely the growth of the shell around the core (carbon around silicon for example), as opposed to nonuniform nucleation. This allows the uniformity of the deposition of the shell around the core to be improved.

The inlet 11 of the first chamber 1 is connected to a supply channel 4 for supplying the core precursor, this channel 4 being connected to a source 9 of the core precursor.

An inert gas is delivered to the first chamber 1 via a duct 12 one portion of which encircles the channel 4, said duct 12 moreover being connected to a source 13 of this gas.

This inert gas mainly serves to confine the zone of interaction. This makes it possible to prevent any contact between the precursor and the walls of the chamber, thus limiting the risks of chemical reaction with the precursors of the silicon of the core and/or of the shell. This inert gas also prevents any oxidation of the core, once formed, with the surrounding air.

By virtue of this confinement, any pollution of the core is further limited or even prevented. The core thus retains its chemical integrity, formation of oxides or other chemical compounds being prevented.

This inert gas may possibly also aid with transportation of the cores of the nanoparticles.

In addition, injecting the inert gas and the precursors of the core colinearly slightly enhances this confinement. This colinearity is related to the fact that the portion of the channel 12 that encircles the portion of the channel 4 extends in the same direction as this channel 4. Moreover, this colinearity is also present in the communication channel 3, which advantageously extends in the direction, at the inlet 11, in which the precursors of the core and the inert gas are injected.

The laser beam 10 is emitted by an optical device 200, 201, 202, 203 comprising, for this purpose, a laser located outside the chambers 1, 2 of the reactor 100. This optical device will be described in more detail below with reference to FIGS. 3(a) to 3(d). The core precursor is formed into nanoparticle cores by pyrolysis in this first zone of interaction 5.

The cores thus formed then pass into the communication channel 3 between the two chambers 1, 2. This communication channel 3 serves to transmit the nanoparticle cores formed in the first chamber 1 in the direction of the second chamber 2. For this purpose, it is advantageously equipped with a conical lower portion 32. Furthermore, the flow of inert gas advantageously aids with transfer of the nanoparticle cores to the second chamber 2.

In parallel to the transmission of the nanoparticle cores to the second chamber 2, a shell precursor is delivered to the second chamber 2. For this purpose, the inlet 21 of the second chamber 20 is one end of a supply channel 6 for supplying this precursor, said channel being connected to a source 14 of this precursor. In this particular case, one portion of this supply channel is housed inside the communication channel 3 between the two chambers 1, 2 (FIG. 2).

It should be noted that the portion 61 extends along the length of the communication channel 3 (colinearity). Moreover, the shell precursors, once injected into the second chamber 2, follow the same linear movement of the core particles and of the inert gas accompanying these particles. This also limits dispersion of the core particles in the second chamber 2.

The nanoparticle cores and the shell precursor therefore mix in the second chamber 2. This mixing must occur before a second zone of interaction 7 with the laser beam 10. For this reason, the flow conditions of each precursor must be controlled.

The shell precursor of the nanoparticles is thus delivered, with the nanoparticle cores, to the zone of interaction 7 with the laser beam 10, in order to form the shell and the core-shell nanoparticles. This laser beam 10 is generated by the aforementioned optical device.

Once the core-shell nanoparticles have been formed, they are extracted from the reactor 100 by way of a channel 15 for collecting these nanoparticles, advantageously comprising collectors with filtering barriers.

Each chamber 1, 2 is supplied with precursor independently. In practice, this therefore allows any type of core-shell nanoparticle to be formed.

Moreover, the device 100 allows core-shell nanoparticles having a shell uniformly distributed around the core to be obtained.

In addition, the precursors may be gaseous, liquid or solid.

By way of example of gaseous precursors, it may be envisioned to use silane, ethylene or diborane.

It may be envisioned to use titanium isopropoxide as a liquid precursor. It may also be envisioned to add acetylene, titanium tetrachloride, aluminum or zirconium butoxide, acetonates, acetylacetonates, rare-earth or metal nitrates and more generally any organometallic precursor used in chemical vapor deposition, insofar as the latter are mixed with a sensitizer allowing them to absorb the laser radiation.

Lastly, it may be envisioned to use solid powders, such as a zinc nanopowder, advantageously delivered in an inert carrier gas.

Figure 1:
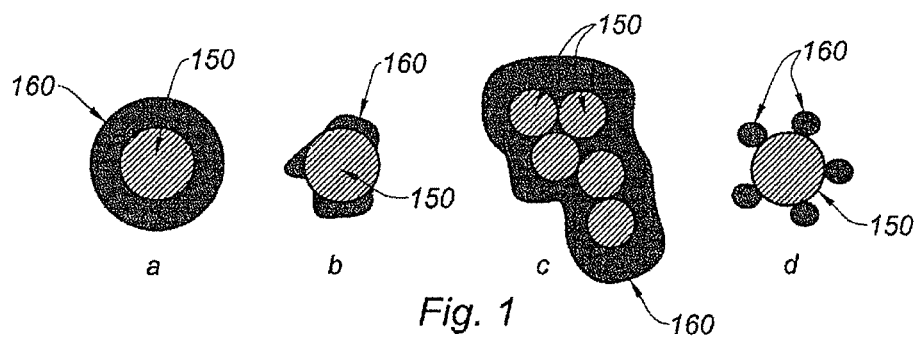
FIGS. 1(a) to 1(d) represent core-shell nanoparticles having varying degrees of encapsulation.

Various optical devices capable of being employed with the reactor 100 shown in FIG. 1 will now be described. Each optical device has the function of illuminating each of the two chambers and comprises, for this purpose, at least one laser.

In FIG. 3(a), the optical device 200 comprises a laser 8 and a set of two mirrors 30, 31. The laser 8 is placed to the side of the first chamber 1 in order to illuminate the latter first. The laser beam 10 has an axis of propagation secant to the vertical and, in this particular case, horizontal. The first chamber 1 therefore comprises sidewalls 16, 17 that are transparent to the laser beam 10 in order to allow the laser beam to pass through it, from one side to the other, along a substantially horizontal axis.

Provision could be made for another respective arrangement of the laser 8 relative to the reactor 100. However, this arrangement is a particularly practical way of ensuring that the laser beam is able to interact with said precursors in order to form the core and shell.

The set of mirrors 30, 31 allows the laser beam 10 output from the first chamber 1 to be redirected toward the second chamber 2, so that the laser beam passes through the second chamber along an axis of propagation that is secant to the vertical and, in this particular case, horizontal. The second chamber 2 therefore comprises sidewalls 18, 19 that are transparent to the laser beam 10.

Advantageously, the mirrors 30, 31 will be planar and associated with one or more focusing means 40, 41, 42. Thus, as shown in FIG. 3(a), it is possible to implement a first focusing means 40 between the laser 8 and the first chamber 1, a second focusing means 41 between the first chamber 1 and the mirror 30 (in order to recollimate the laser beam 10 output from the first chamber 1 before it is reflected by the mirrors 30, 31) and lastly, a third focusing means 42 between the mirror 31 and the second chamber 2.

As a variant, the third focusing means 42 may be removed while the two other focusing means 40, 41 are retained. In this case, only the laser beam 10 passing through the first chamber 1 is focused.

As another variant, it is also possible to retain only the third focusing means 42, the other two 40, 41 not being implemented. In this case, only the laser beam 10 passing through the second chamber 2 is focused.

Moreover, these planar mirrors 30, 31 may be implemented alone, without focusing means.

A beam splitter 50 may be provided between the two chambers 1, 2 on the path of the laser beam 10, and advantageously between the two mirrors 30, 31. For example, it may be envisioned to use a beam splitter 50 made of ZnSe.

Insertion of a beam splitter 50 allows the power of the laser beam 10 passing through the second chamber 2 to be controlled, which, in this case, is necessarily lower than the power of the laser beam 10 passing through the first chamber 1.

This may be advantageous depending on the chemical nature of the precursors injected into the chambers 1, 2. Specifically, the decomposition of certain precursors requires less energy than the decomposition of others. This may also be advantageously used to control the structural properties of the core-shell nanoparticles finally obtained. Specifically, this requires relatively high temperatures that may be controlled with the beam splitter 50.

Means 71, 72 for stopping the laser beam are provided, especially at the exit from the second chamber 2.

It should be noted that the planar mirrors 30, 31 could be replaced by concave mirrors. Such mirrors not only allow the laser beam 10 to be redirected from one chamber to the other just like planar mirrors, but they also carry out the function of focusing the laser beam 10. A focusing means is therefore no longer necessary with a concave mirror. For example, it is envisionable to replace the mirror 31 and the focusing means 42 with such a concave mirror.

In this case, the location of the concave mirrors is important if the zones of focus of the laser beam in each chamber 1, 2, are to be defined correctly, these zones of focus defining the zones of interaction 5, 7 with the precursors.

The variant 201 of the optical device 200 described with reference to FIG. 3(*a*) does not therefore allow the power of the laser beam 10 in the second chamber 2 to be higher than the power in the first chamber 1.

For this reason, and depending on the chemical nature of the precursors of the core and shell, it is envisionable to invert the circuit, i.e. to make the laser beam 10 output by the laser 8 pass first through the second chamber 2 and then through the first chamber 1.

Figure 3:
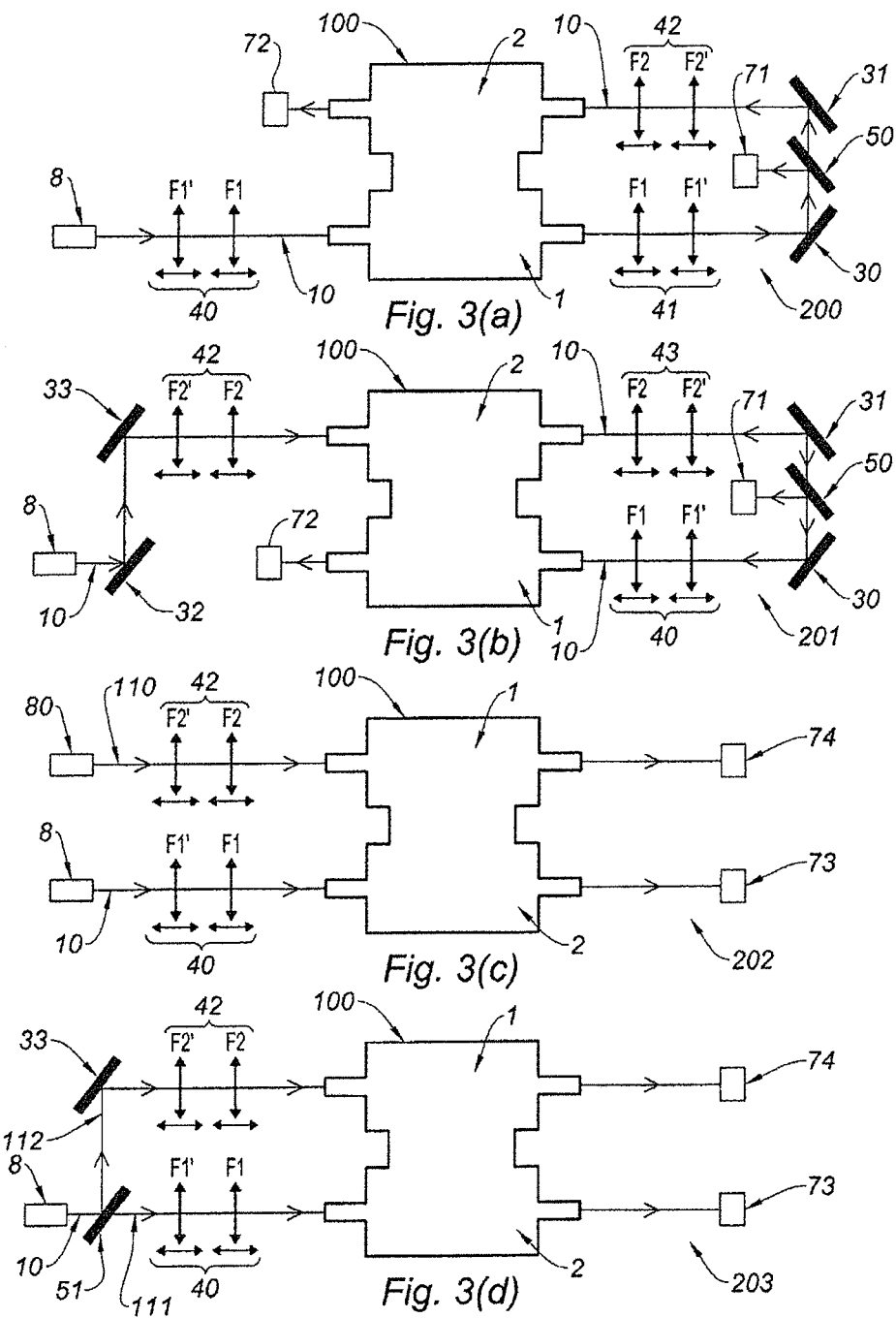
FIGS. 3(a) to 3(d) show a number of variants of a device according to the invention, each variant differing from the others in the optical device used with the reactor shown in FIG. 1.

This possibility is shown in FIG. 3(*b*).

Relative to FIG. 3(*a*), the laser 8 has not changed place relative to the reactor 100. A set of mirrors 30, 31, 32, 33 is provided in order to make the laser beam 10 pass through the second chamber 2 then through the first chamber 1.

Advantageously, the mirrors 30, 31, 32, 33 are planar mirrors associated with focusing means 41, 42, 44 certain 41, 44 of which serve to define the zones of interaction with the precursors in the chambers 1, 2.

Thus, as shown in FIG. 3(*b*), it is possible to implement a first focusing means 42 between the laser 8 and the second chamber 2 and more precisely after the mirror 33, a second focusing means 43 between the second chamber 2 and the mirror 31 (for recollimating the laser beam 10 output from the second chamber 2 before it is reflected by the mirrors 30, 31) and lastly, a third focusing means 40 between the mirror 30 and the first chamber 1.

As a variant, the third focusing means 40 may be removed while the two other focusing means 40, 41 are retained. In this case, only the laser beam 10 passing through the second chamber 2 is focused.

As another variant, it is also possible to retain only the third focusing means 40, the other two 42, 43 not being implemented. In this case, only the laser beam 10 passing through the first chamber 1 is focused.

Moreover, the focusing means may be removed and only the planar mirrors retained.

As another variant, the planar mirrors 30, 31, 33 are replaced by concave mirrors also providing the function of focusing the laser beam.

Moreover, a beam splitter 50 may be provided between the second chamber 2 and the first chamber 1 relative to the direction of travel of the laser beam 10 and advantageously between the two mirrors 30, 31. This splitter is for example made of ZnSe. It is thus possible to control the ratio of the power of the laser beam 10 passing through the first chamber 1 to the power of the laser beam passing through the second chamber 2.

Of course, the laser 8 could be placed facing the second chamber 2, thereby allowing the mirrors 32, 33 to be removed.

If it is desired to overcome a possible problem as regards the available power of the laser beam in the two chambers, it is even envisionable to implement an optical device 202 comprising two lasers 8, 80, each laser being dedicated to illuminating one of the two chambers 1, 2 (laser beam 10 or laser beam 110, respectively).

This possibility is shown in FIG. 3(*c*).

Each laser 8, 80 is then placed beside the reactor 100, facing one of the two chambers. Each laser beam 10, 110 therefore passes through the associated chamber sideways.

Advantageously, with each laser 8, 80 is associated a focusing means 40, 42 serving to define the aforementioned zones of interaction 5, 7. As a variant, no focusing means are implemented or indeed only one of the two lasers 8, 80 is associated with such a focusing means.

Lastly, it is also envisionable to implement an optical device 203 capable of illuminating both chambers 1, 2 in parallel with a single laser 8. The laser 8 may then be positioned, relative to the reactor 100, as shown in FIG. 3(*a*) or 3(*b*). For this purpose, a beam splitter 51 is necessary to split the laser beam 10 output by the laser 8 into two beams 111, 112. This splitter 51 may be made of ZnSe. It may, depending on the circumstances, be defined to transmit more power to one of the two chambers 1, 2 or to transmit an equal power to each chamber 1, 2. At least one (preferably planar) mirror 33 is in this case necessary.

The latter possibility is shown in FIG. 3(*d*).

It should be noted that the latter possibility is particularly flexible operationally. Specifically, it allows the power of the illumination injected into each chamber 1, 2 to be controlled without being constrained by a specific ratio of the powers between the two chambers, as was the case for the variants of FIGS. 3(*a*) and 3(*b*). Furthermore, it avoids the need for two lasers, unlike the variant shown in FIG. 3(*c*).

Advantageously, with each laser beam 111, 112 is associated a focusing means 40, 42 that serves to define the aforementioned zones of interaction 5, 7. In this case, the mirror 33 is a planar mirror.

As a variant, only one of the two laser beams 111, 112 is associated with such a focusing means. In the case where only the laser beam 112 passing via the mirror 33 is focused, the mirror 33 is planar.

The planar mirror 33 and the focusing means 42 shown in FIG. 3(d) may be replaced by a concave mirror also providing the focusing function carried out by the focusing means 42.

According to another variant, no focusing means is provided.

Whatever the variant envisioned for the optical device, the laser 8, 80 may be a $CO_2$ laser emitting at a wavelength of 10.6 microns. Other types of lasers known to those skilled in the art for their capacity to decompose certain precursors may be envisioned.

Each focusing means 40, 41, 42, 43 may be formed by a spherical lens or one or two cylindrical lenses. In FIGS. 3(a) to 3(d), each focusing means 40, 41, 42, 43 consists of two cylindrical lenses.

When only a spherical lens is employed, the diameter of the focal spot defining the core of the zone of interaction may be made to vary by modifying the distance between the lens and the zone of interaction. With a cylindrical lens, the height of the focal spot may be made to vary by modifying the distance between the lens and the zone of interaction. With two cylindrical lenses, both the width and the height of the focal spot may be made to vary by modifying, on the one hand, the distance between the two lenses, and on the other hand, the distance between the pair of lenses and the zone of interaction.

It should be noted that, in practice, to modify the distance between the means (40, 42 in FIG. 3(a); 42, 40 in FIG. 3(b); and 40 and/or 42 in FIGS. 3(c) and 3(d)) for focusing the laser beam 10 and the zone of interaction between this laser beam 10 and the precursors it is the distance between this focusing means and the neighboring chamber 1, 2 in which the zone of interaction is located (in FIG. 3(a) for example, the focusing means 40 is that neighboring the first chamber 1 and the focusing means 42 is that neighboring the second chamber 2) that is modified.

These various focusing means therefore make it possible, via modification of the position of the lenses, to define, for a given laser, the incident power per unit area (fluence) of the laser beam, and therefore the temperature in this zone.

This makes the device highly adaptable, useful for synthesizing different types of core-shell nanoparticle. The choice is made depending on the chemical nature of the precursors intended to form the core and shell of the core-shell nanoparticles.

For example, a spherical lens of focal length F'=750 mm may be used, the position of which may be adjusted to a distance comprised between 750 mm and 1060 mm from the zone of interaction between the laser beam and the precursors.

In this example, the diameter of the focal spot is then adjustable, as a function of the position of the lens, between a minimum value close to 0.5 mm and a maximum value of a few millimeters. The minimum diameter of the focal spot is obtained when the distance between the lens and the zone of interaction between the laser and the precursors is equal to the focal length of the lens. In contrast, the maximum size of the focal spot is obtained when the distance between the lens and the point of interaction of the laser and precursors is largest. In this way, it is possible to vary the incident fluence of the laser at the point of interaction while keeping the incident laser power constant. The incident fluence of the laser at the point of interaction may have an influence on the efficiency of decomposition of the precursors.

By using two cylindrical lenses instead of one spherical lens, and by crossing their focal planes, the height and width of the focal spot may be adjusted separately by varying the distance of each lens relative to the zone of interaction.

If it is desired to decrease the minimum size of this focal spot, it is envisionable to implement a beam expander (not shown) at the exit of the laser 8, 80. Thus, with a $CO_2$ laser operating at a wavelength of 10.6 microns, a laser beam expanded to a diameter of 45 mm and a spherical lens of 150 mm focal length, it is reasonably possible to expect to obtain a focal spot of about 170 microns.

The size of the focal spot may also be varied with concave mirrors, in particular by modifying the fluence of the laser beam. To do this, the position of the concave mirror relative to the neighboring chamber of the reactor is then adjusted.

The reactor 100 of the device according to the invention described with reference to FIG. 2 may be modified.

Figure 4:
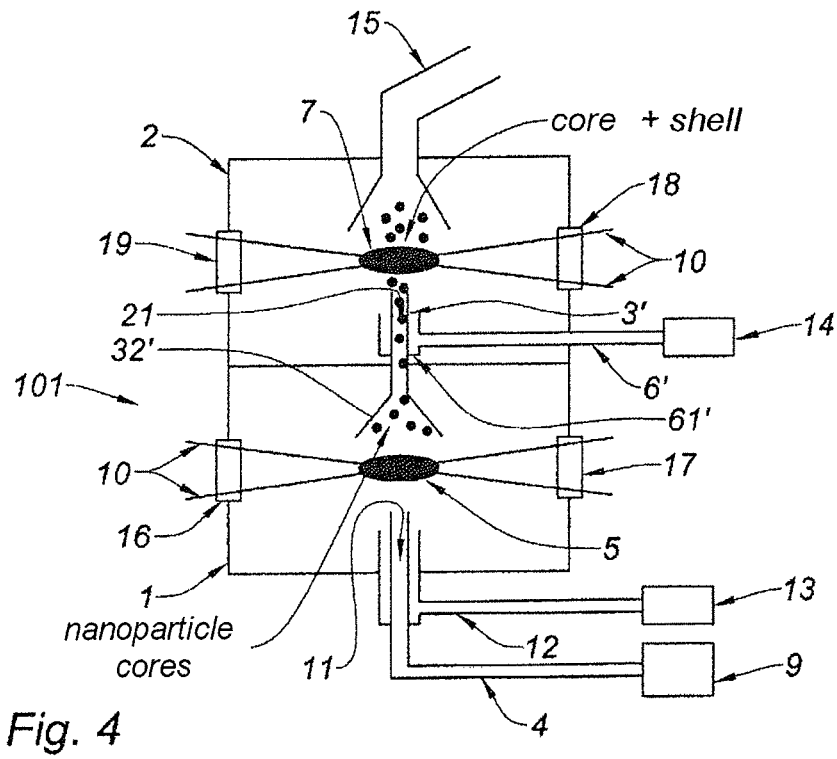
FIG. 4 is a schematic showing one variant of the reactor shown in FIG. 1, which variant is capable of being employed in combination with any one of the optical devices shown in FIGS. 3(a) to 3(d)

FIG. 4 thus shows a variant embodiment of the reactor. This variant is essentially characterized by an inversion of the location of the supply channel 6' for supplying the shell precursors relative to the communication channel 3; the mixture between the two taking place in both cases in the second chamber 2.

In this reactor 101, the shell precursor is delivered with a supply channel 6' the end of which encircles the communication channel 3' between the two chambers 1, 2. The mixing of the shell precursor and the nanoparticle cores therefore occurs in the second chamber 2 itself. This mixing must occur before the zone of interaction 7 with the laser beam 10.

The situation is therefore fairly similar, as regards the question of flow conditions, to that encountered with the variant in FIG. 2.

However, since the width of the communication channel 3' between the two chambers is smaller than that of the communication channel 3 (FIG. 2), the nanoparticle cores may be confined to a smaller volume, this configuration being particularly well adapted to the focus of the laser 8.

Figure 5:
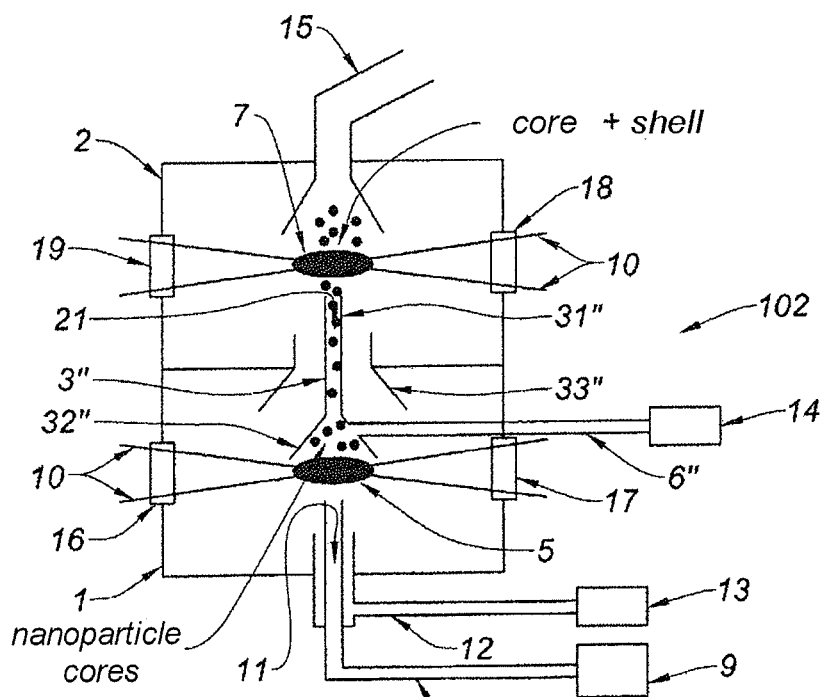
FIG. 5 is a schematic showing a variant of the reactor shown in FIG. 1, which variant is also capable of being employed in combination with any one of the optical devices shown in FIGS. 3(a) to 3(d).

Advantageously, the communication channel 3' comprises a lower portion 32', housed in the first chamber 1, which takes the form of a cone, in order to improve the collection of the nanoparticle cores. FIG. 5 shows another variant embodiment of this reactor. In this variant, the precursors of the shell are mixed with the core particles before they reach the second chamber 2.

In this reactor 102, the supply channel 6" for supplying the shell precursor opens into the communication channel 3" between the two chambers 1, 2. The inlet 21 of the shell precursor into the second chamber 2 is then that end of the communication channel 3" which opens into the second chamber 2.

In comparison to the embodiments in FIGS. 2 and 4, this arrangement makes it possible to ensure even more uniform mixing of the shell precursor and the nanoparticle cores formed in the first chamber 1. This is related to the fact that the communication channel 3" has a column 31" that is long enough to promote homogenization of this mixture.

Advantageously, the lower end of the communication channel 3", which end is housed in the first chamber 1, has a conical shape 32" aiding collection of the nanoparticle cores.

It should moreover be noted that a uniform mixture may be obtained for large variations in the flow conditions of the core precursor or shell precursor. In particular, for high flow rates, provision is advantageously made for an additional communication channel 33" between the two chambers 1, 2, the walls of which for example define a cone shape, encircling the communication channel 3", in order for the inert gas, which cannot pass through the communication channel 3", to pass around it. This allows the uniformity of the mixing of the nanoparticle cores, this inert gas and the core precursor in the second chamber 2 to be improved. As a result, the uniformity of the distribution of the shell around the nanoparticle cores formed is excellent.

Under lower flow rate conditions, the additional communication channel 33" may be removed.

EXAMPLE EMBODIMENT

Synthesis of the Nanoparticles the Core of Which is Made of Silicon and the Shell of Carbon The optical device 200 employed is that in FIG. 3(*a*) without a beam splitter. Focusing means 40, 41 were used between the laser 8 and the first chamber 1 and between the first chamber 1 and the mirror 30. More precisely, a cylindrical lens 40 of 500 mm focal length was placed between the laser 8 and the first chamber 1 and a similar lens 41 was placed between the first chamber 1 and the mirror 30, 1000 mm from the lens 41. The lens 41 served to recollimate the laser beam 10 before it reached the mirrors 30, 31. The laser beam was not focused again before it entered into the second chamber 2.

The reactor 100 was that shown in FIG. 2. Silane was used as a (silicon) core precursor. Ethylene was used as a (carbon) shell precursor.

The following parameters were used:
silane flow rate (chamber 1)=46 sccm;
ethylene flow rate (chamber 2)=406 sccm;
power of the laser=560 W;
pressure in the reactor=atmospheric pressure;
diameter of the inlet 11=2 mm;
diameter of the inlet 21=10 mm;
diameter ($d_1$) of the communication channel 3 on the side of the second chamber=24 mm; and
diameter ($d_2$) of the line encircling the channel 4=20 mm.

Silicon particles of about 100 nm encapsulated in a carbon shell of about 5 nm to 10 nm thickness were thus able to be obtained.

These nanoparticles may especially be used to form anode materials in lithium-ion batteries.

Moreover, to give other examples, it is possible to synthesize nanoparticles having both luminescent properties and magnetic properties. Thus it is possible to synthesize nanoparticles the core of which is made of silicon (providing luminescent properties) and the shell is made of a material such as iron or iron oxide (providing magnetic properties). In contrast, it is possible to produce nanoparticles the core of which is made of a material having magnetic properties (iron, iron oxide, etc.) with a shell made of silicon.

The invention also relates to a process for synthesizing core-shell nanoparticles by laser pyrolysis, characterized in that it comprises the following steps:
(a) injecting a core precursor into a first chamber of a reactor;
(b) illuminating the core precursor with a laser beam in order to form, by pyrolysis, nanoparticle cores;
(c) transporting the nanoparticle cores thus formed in step (b) into a second chamber of the reactor communicating with the first chamber;
(d) injecting a shell precursor into the second chamber of the reactor; and
(e) illuminating the shell precursor with a laser beam in order to form, by pyrolysis, the shell of the nanoparticles and ensure this shell is deposited around the cores.

From the point of view of one nanoparticle, its core is thus created in the first chamber then its shell in the second chamber. However, this process is carried out continuously insofar as the injecting steps are carried out continuously. By virtue of the laser pyrolysis, the injection of the precursors allows a continuous flow of core-shell nanoparticles to be output from the reactor.

Step (a) and/or step (d) are/is carried out using an inert gas such as argon.

Moreover, the process may comprise a step consisting in modifying the distance between a means for focusing the laser beam and the neighboring chamber of the reactor. This adjustment allows, for a given laser power, the fluence of the laser beam in the zone of interaction 5, 7 to be modified.

Lastly, a step (f) consisting in gathering the nanoparticles thus formed after step (e) to obtain a nanocomposite material may be carried out.

The pressure in the reactor 100 may be the same in both chambers 1, 2. However, and as specified above, provision may be made to keep the first chamber 1 at a higher pressure than the second chamber 2, in order to promote, depending on the case, a uniform reaction (formation of a core made of silicon, for example) or a nonuniform reaction (deposition of the carbon shell around a core made of silicon, for example).

The various variants of the device according to the invention described above may be used for other applications than continuous synthesis of core-shell nanoparticles.

Specifically, it is possible to use the reactor 100, 101, 102 to anneal nanoparticles.

For this purpose, nanoparticles are formed by injecting a precursor via the inlet 11 of the first chamber 1, but no precursor is injected via the inlet 21 of the second chamber 2. The nanoparticles are thus formed in the first chamber 1 by laser pyrolysis, then transmitted into the second chamber 2 in which the laser beam controllably reheats these nanoparticles. The temperature is controlled especially by choosing the power of the laser, the beam splitter or by adjusting the focus of the laser beam.

This anneal may be used to modify the volume of the nanoparticles without coalescence with other nanoparticles or, in contrast, to promote coalescence of nanoparticles together (with addition of material, i.e. with addition of a precursor, via the inlet 21 of the second chamber, possibly of identical nature to the precursor injected into the first chamber via the inlet 11).

This anneal may also be a surface anneal, for example in order to correct surface defects (passivation). In contrast, this surface anneal may serve to activate reactional sites on the surface of the nanoparticles, dependent on the reactional atmosphere which is set by the nature of the carrier gas of the precursor.

This anneal may also be used to complete the decomposition of the precursor injected into the first chamber, if the pyrolysis in the first chamber turns out not to be complete.

Use of the device according to the invention for this purpose therefore avoids the need for an anneal with an external device.

It will be noted that it is not necessary, for this annealing application, to provide, in the device, means (6, 21, 14 in FIG. 2; 6', 14 in FIG. 4; and 6", 14 in FIG. 5) for injecting a shell precursor.

In other words, for this nanoparticle annealing application, the device may then comprise:
a reactor 100, 101, 102 comprising:

a first chamber 1 for the synthesis of the nanoparticles, which chamber 1 is equipped with an inlet 11 for a nanoparticle precursor;

a second chamber 2 for annealing the nanoparticles; and at least one communication channel 3, 3', 3" between the two chambers 1, 2 for the nanoparticles intended to be formed in the first chamber 1 in the direction of the second chamber 2; and an optical device 200, 201, 202, 203 for illuminating each of the two chambers 1, 2, this device comprising at least one laser 8, 80 able to emit a laser beam 10, 101 intended to interact with said precursors in order to form the core and the shell.

The various variants of the device for synthesizing core-shell nanoparticles described with reference to the appended drawings are transposable to the device which may be modified to serve to anneal nanoparticles, these variants then not comprising any of the means required to inject a shell precursor into the second chamber.

The invention claimed is:

1. A device for synthesizing core-shell nanoparticles by laser pyrolysis, comprising:
a reactor comprising:
a first chamber for the synthesis of the core, which chamber is equipped with an inlet for a core precursor;
a second chamber for the synthesis of the shell, which chamber is equipped with an inlet for a shell precursor, the second chamber being separated from the first chamber by a separation wall; and
one single communication channel passing through the separation wall of the two chambers for transmitting the nanoparticle cores intended to be formed in the first chamber in the direction of the second chamber; and
an optical device for illuminating each of the two chambers, this device comprising at least one laser able to emit a laser beam intended to interact with said precursors in order to form the core and the shell.

2. The device as claimed in claim 1, wherein the optical device comprises a plurality of mirrors arranged so that the laser beam emitted by the laser is able to illuminate the two chambers in succession.

3. The device as claimed in claim 2, wherein the optical device comprises at least one beam splitter for adjusting the power of the laser beam in each of the two chambers.

4. The device as claimed in claim 1, wherein the optical device comprises a beam splitter and at least one mirror arranged so that the laser beam emitted by the laser is divided into two beams each able to illuminate one of the two chambers.

5. The device as claimed in claim 1, wherein the optical device comprises a first laser for illuminating the first chamber and a second laser for illuminating the second chamber.

6. The device as claimed in claim 1, wherein the optical device comprises at least one focusing means placed between the or each laser and at least one of the two chambers.

7. The device as claimed in claim 6, wherein the focusing means comprising two cylindrical lenses, the distance between the two cylindrical lenses is adjustable.

8. The device as claimed in claim 1, wherein the distance between said at least one focusing means and the neighboring chamber is adjustable.

9. The device as claimed in claim 1, wherein the inlet of the shell precursor into the second chamber is one end of a supply channel for supplying this precursor, one portion of which encircles the communication channel between the two chambers.

10. The device as claimed in claim 9, wherein the portion of the supply channel for supplying the shell precursor, which encircles this communication channel, extends colinearly with the communication channel.

11. The device as claimed in claim 1, wherein the inlet of the core precursor into the first chamber is one end of a supply channel for supplying this precursor, one portion of which is encircled by a portion of a channel connected to a source of inert gas.

12. The device as claimed in claim 11, wherein that portion of the supply channel for supplying the core precursor which is encircled by a portion of the channel connected to the source of inert gas extends colinearly with this portion of said channel.

13. The device as claimed in claim 1, wherein the separation wall separating the second chamber from the first chamber defines both chambers.

14. The device as claimed in claim 1, wherein the one single communication channel comprises a first portion extending into the first chamber from the separation wall and a second portion extending into the second chamber from the separation wall.

15. The device as claimed in claim 14, wherein the first portion of the one single communication channel defines a cone shape.

16. A process for synthesizing core-shell nanoparticles by laser pyrolysis, wherein the process comprises the following steps:
(a) injecting a core precursor into a first chamber of a reactor;
(b) illuminating the core precursor with a laser beam in order to form, by pyrolysis, nanoparticle cores;
(c) transporting the nanoparticle cores thus formed in step (b) into a second chamber of the reactor communicating with the first chamber by means of one single communication channel passing through a separation wall separating the two chambers;
(d) injecting a shell precursor into the second chamber of the reactor; and
(e) illuminating the shell precursor with a laser beam in order to form, by pyrolysis, the shell of the nanoparticles and ensure this shell is deposited around the cores.

17. The process as claimed in claim 16, wherein step (a) and/or step (d) are/is carried out using an inert gas.

18. The process as claimed in claim 17, wherein the inert gas is argon.

19. The process as claimed in claim 16, wherein the process comprises a step consisting in modifying the distance between a means for focusing the laser beam and the neighboring chamber of the reactor.

20. The process as claimed in claim 16, wherein the pressure in the first chamber is higher than the pressure in the second chamber.

21. The process as claimed in claim 16, wherein the separation wall separating the second chamber from the first chamber defines both chambers.

22. The process as claimed in claim 16, wherein the one single communication channel comprises a first portion extending into the first chamber from the separation wall and a second portion extending into the second chamber from the separation wall.

23. The process as claimed in claim 22, wherein the first portion of the one single communication channel defines a cone shape.

\* \* \* \* \*